US010520534B1

(12) United States Patent
Rowell et al.

(10) Patent No.: US 10,520,534 B1
(45) Date of Patent: Dec. 31, 2019

(54) INTEGRATED SHIELDING FOR MOTOR AND TEST ANTENNA DE-COUPLING

(71) Applicant: Rohde & Schwarz GmbH & Co. KG, Munich (DE)

(72) Inventors: Corbett Rowell, Munich (DE); Daniel Markert, Deggendorf (DE); Vincent Abadie, Hohenschaeftlarn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1 day.

(21) Appl. No.: 16/025,752

(22) Filed: Jul. 2, 2018

(51) Int. Cl.
| | |
|---|---|
| *H04B 17/00* | (2015.01) |
| *G01R 29/08* | (2006.01) |
| *G01R 29/10* | (2006.01) |
| *H01Q 19/10* | (2006.01) |
| *H01Q 1/12* | (2006.01) |
| *H01Q 1/52* | (2006.01) |
| *H04B 17/27* | (2015.01) |

(52) U.S. Cl.
CPC ..... *G01R 29/0871* (2013.01); *G01R 29/0814* (2013.01); *G01R 29/10* (2013.01); *H01Q 1/125* (2013.01); *H01Q 1/525* (2013.01); *H01Q 1/526* (2013.01); *H01Q 19/10* (2013.01); *H04B 17/27* (2015.01)

(58) Field of Classification Search
CPC ............... H04B 17/27; G01R 29/0871; G01R 29/0814; G01R 29/10; H01Q 1/125; H01Q 1/525; H01Q 1/526; H01Q 19/10

USPC ......... 455/423, 67.11, 67.12, 67.14
See application file for complete search history.

(56) References Cited

U.S. PATENT DOCUMENTS

| | | | | |
|---|---|---|---|---|
| 8,412,112 | B2 * | 4/2013 | Foegelle | H04B 17/21 455/67.11 |
| 8,436,777 | B2 * | 5/2013 | Ito | G01R 29/10 343/703 |
| 9,107,098 | B2 * | 8/2015 | Emmanuel | H04W 24/06 |
| 9,671,445 | B2 * | 6/2017 | Huynh | G01R 29/10 |
| 9,705,190 | B2 * | 7/2017 | Kyosti | H01Q 3/2605 |
| 2008/0305754 | A1 | 12/2008 | Foegelle | |
| 2013/0093447 | A1 * | 4/2013 | Nickel | H04W 24/06 324/750.16 |
| 2014/0210502 | A1 | 7/2014 | Alhorr et al. | |

FOREIGN PATENT DOCUMENTS

WO    WO2017144079 A1    8/2017

* cited by examiner

*Primary Examiner* — Sonny Trinh
(74) *Attorney, Agent, or Firm* — Potomac Technology Law, LLC

(57) ABSTRACT

A measurement system for measurements of a device under test (DUT) is provided. The measurement system includes a first test antenna configured to send radio frequency (RF) radiation to the DUT and to receive RF radiation sent by the DUT. The system further includes a positioning device, including at least one motor, configured to move the DUT about at least one axis of rotation. The system further includes a geometrical fixture configured to absorb RF radiation and to de-couple or shield the DUT from unintended or spurious RF radiation of one or more of the at least one motor and the first test antenna.

18 Claims, 4 Drawing Sheets

INTEGRATED SHIELDING FOR MOTOR AND TEST ANTENNA DE-COUPLING

TECHNICAL FIELD

The invention relates to a measurement system for measurements of a device under test (DUT), and more specifically a system for measurements of a DUT that includes a shield for shielding the DUT from spurious electromagnetic or radio frequency radiation, for example, emitted by a test antenna and a positioner that includes a motor for moving the DUT.

BACKGROUND

Generally, wireless enabled devices have to pass a variety of industry and regulatory certifications before they can be put on the market. The certifications include regulatory/compliance testing such as electromagnetic compatibility (EMC), conformance testing such as protocol, radio frequency (RF), radio resource management (RRM) and location-based service (LBS), as well as performance testing such as over-the-air (OTA) measurements. OTA measurements are specifically performed to measure antenna patterns and include the measurement of the radiated transmit power (TRP) of a device under test at incremental locations surrounding the device. For performing such testing, the device under test (DUT) should be movable in a desired direction to allow accurate measurements within a short measurement time. In order to move the DUT a positioner using a motor as drive unit is usually provided.

Since motors generate unintended electromagnetic radiation that negatively affects measurement results, it is critical to provide an effective shielding between electromagnetic radiation caused by drive-motors and the DUT. Moreover, since a transmission equipment required for performance and conformance testing also generates unintended RF radiation such as unwanted spurious radiation, it is further desired to provide an effective shielding between the unintended RF radiation emitted by the transmission equipment and the DUT.

The document WO2017144079A1 relates to a method and a system for determining the level of out-of-band and spurious emissions generated by radio equipment. Such measurements are especially required for type approval or production line testing in order to satisfy electromagnetic interference (EMI) compliance tests and regulatory requirements, and to satisfy customer requirements. The cited document discloses a test system comprising transmission equipment that is configured to transmit a transmission signal including emissions in an in-band domain and emissions in an unwanted domain. The test system further comprises a measurement equipment and a frequency selective surface that is arranged between the transmission equipment and the measuring equipment to receive the transmission signal. The frequency selective surface attenuates the transmission signal in the in-band domain of the transmission signal but allows propagation of the transmission signal in the unwanted domain of the transmission signal. The aforementioned measurement equipment is configured to measure parameters of the transmission signal in the unwanted domain in order to determine the level of out-of-band and spurious emissions. Even though the cited document discloses a frequency selective surface between the transmission equipment and the measuring equipment to separate one overall signal in unwanted and wanted signals, however, the document does not teach an effective shielding of a DUT from unintended radiation emitted by a motor and/or a test antenna. The document is not at all related to the shielding of devices from unintended RF radiation.

The document US20140210502A1 is related to a method and apparatus for an enhanced reverberation chamber. The cited document discloses an apparatus including positioners connected to at least one motor, wherein devices involved with a test may be mounted to the positioners. In one embodiment, a measurement antenna is mounted on a first positioner and a calibration antenna to be tested is mounted on a second positioner. A line of sight (LOS) shield made of metallic material separates the first and second positioners. The LOS shield is used to block line of sight electric field components between the devices mounted on the two positioners. Disadvantageously, however, the metallic LOS shield reflects radio frequency (RF) radiation instead of absorbing it. The reflected radiation can interfere with other signals and falsify measurement results. Moreover, the cited document fails to recognize that a DUT has to be shielded from unintended radio frequency radiation emitted by a motor or a test antenna.

What is needed, therefore, is a measurement system for measurements of a device under test (DUT), which includes a shield for shielding the DUT from unintended radio frequency radiation emitted by a motor and/or a test antenna.

SOME EXAMPLE EMBODIMENTS

Embodiments of the present invention advantageously address the foregoing requirements and needs, as well as others, by providing a measurement system and corresponding method for measurements of a device under test (DUT), which includes a shield for shielding the DUT from unintended radio frequency radiation emitted by a motor and/or a test antenna, for example, an absorbing geometrical fixture configured to absorb radio frequency (RF) radiation separating the motor and a test antenna from the DUT.

According to a first aspect of the invention, a measurement system for measurements of a device under test (DUT) is provided. The measurement system comprises a first test antenna configured to send radio frequency (RF) radiation to the DUT and to receive RF radiation from the DUT. The system further includes a positioner with at least one axis of rotation configured to move the DUT using a motor, and an absorbing geometrical fixture configured to absorb RF radiation. The absorbing geometrical fixture separates the motor moving the positioner and the first test antenna from the DUT such that the DUT is de-coupled from the motor and/or from the first test antenna. The wording "de-coupled" in this context means electrically shielded or isolated and is further explained herein.

Advantageously, the DUT is shielded from unintended electromagnetic radiation emitted by one or more motors, for example, used in combination with a positioner to move the DUT in any desired direction. The DUT is further shielded from unintended electromagnetic radiation emitted by the first test antenna. Moreover, the motor and the first test antenna are also not affected by unintended electromagnetic radiation emitted by the DUT. Thus, as used herein, the terminology "de-coupled" means that minimal or no unintended electromagnetic radiation, either from the motor or from the first test antenna, reaches the DUT, and that minimal or no unintended electromagnetic radiation from the DUT reaches either the motor or the first test antenna.

The de-coupling of the DUT from the motor and first test antenna is particularly important, since the unintended electromagnetic radiation emitted by the motor and/or by the first test antenna would negatively affect the measurements taken by the DUT. Further, the unintended electromagnetic radiation emitted by the DUT would negatively affect the measurements taken by the first test antenna and could disturb the function of one or more motors. Using the terminology "first test antenna" includes any further test antenna located outside the positioner and configured to send and receive intended radiation to/from the DUT. Further, the terminology "motor" in this context includes also motor control units, such as frequency converters, which also generate unintended electromagnetic waves.

For example, unintended RF radiation from the first measurement antenna may include RF radiation from a side lobe or any RF radiation that is not intended to be received by the DUT.

By way of example, the absorbing geometrical fixture may be circularly shaped with RF absorbing material on both sides.

According to a first implementation form of the provided measurement system, the measurement system is located inside a shielded room or chamber. Alternatively or additionally, the system further includes a signal generator/analyzer unit configured to create RF signals and to receive and analyze RF signals.

By way of example, the shielded room or shielded chamber is a radio frequency (RF) shielded room or chamber, which provides the necessary RF quiet environment in which to conduct for instance EMC testing and performance testing of wireless devices. By way of further example, the shielded room or chamber may be an anechoic room or chamber, which means that the room or chamber completely absorbs reflections of electromagnetic waves. By way of further example, the shielded room or chamber may be an electromagnetic reverberation room or chamber, which is a room with a minimum of absorption of electromagnetic energy. For generating appropriate test signals required to feed the first test antenna such that the first test antenna is able to send RF radiation to a DUT and for analyzing RF signals received by the first test antenna from the DUT the signal generation/analyzing unit is provided. For example, a variety of signal generation/analyzing units are available on the market that allow the user to select the appropriate units for the measurement tasks.

According to a further implementation form of the provided measurement system, the RF radiation sent by the first test antenna is received indirectly by the DUT via a reflector and/or the RF radiation sent by the DUT is received indirectly by the first test antenna via the reflector. Advantageously, using reflectors, such as parabolic reflectors, inside a shielded anechoic chamber allows projecting a small radiating source (e.g., the first test antenna, such as a horn antenna) into the far field. The reflectors are used to transform a spherical wave into a plane wave with far-field characteristics and allows far-field measurements even using less space. In other words, by using a reflector or any appropriate focusing system, a spherical wave can be transformed into a plane wave at short distance.

According to a further implementation form of the provided measurement system, the DUT is de-coupled from the motor and the first test antenna such that no unintended RF radiation either from the motor or from the first test antenna is received by the DUT and/or that no unintended RF radiation from the DUT is received by the first test antenna. Advantageously, de-coupling the DUT from the motor and the first test antenna prevents the DUT from receiving unintended RF radiation that may negatively affect measurement results, such as measurement accuracy. De-coupling the DUT from the first test antenna and the motor also prevents the first test antenna and/or the motor from receiving unintended RF radiation that may negatively affect the measurement of the first test antenna and/or the performance of the motor or even causes malfunctions of the motor.

According to a further implementation form of the provided measurement system, the DUT is located in the far-field of the RF radiation emitted by the first test antenna. Advantageously, the measurements of antenna characteristics such as antenna gain, radiation pattern, directivity or efficiency are thereby made in the far-field.

According to a further implementation form of the provided measurement system, the absorbing geometrical fixture is directly attached to the positioner or is integrally formed with the positioner. Advantageously, directly attaching the absorbing geometrical fixture to the positioner ensures that the geometrical fixture is moved with the positioner. By way of example, the positioner may be constructed as a u-shaped arm that is suitable for performing movements using a motor. The u-shaped positioner may be further capable of holding the DUT. Further, the positioner may be configured to perform linear movements or movements around one or more axes of rotation. Further, attaching the absorbing geometrical fixture to the moveable u-shaped arm ensures that the geometrical fixture separates the motor and the first test antenna from the DUT and vice versa, even though the positioner is moving. Thus, the de-coupling and/or shielding of the DUT from the motor and the first antenna is independent from the position of the positioner, respectively the DUT.

According to a further implementation form of the provided measurement system, the positioner and the absorbing geometrical fixture are movable up and down. By way of example, the positioner can be linearly moved upwards and downwards. Advantageously, the upwards and downwards movement allows adjustment of the position of the absorbing geometrical fixture attached to or integrally formed with the positioner with respect to the first test antenna and/or the motor.

According to a further implementation form of the provided measurement system, the distance by which the positioner is moved upwards or downwards depends on the measurement frequency bands emitted by the first test antenna. Advantageously, the upwards and downwards movement allows to adjust the position of the DUT within the far-field of the radiation emitted by the first test antenna.

Further, since different measurement frequency bands provide different phase centers, the position of the absorbing geometrical fixture may thus be positioned in order to ensure that the desired de-coupling effect for various measurement frequency bands is given.

According to a further implementation form of the provided measurement system, the absorbing geometrical fixture is mounted such that it can be rotated with one of the axis of the positioner in order to reduce space between the positioner and the absorbing geometrical fixture. Advantageously, by attaching the absorbing geometrical fixture to one of the axis of the positioner, which causes the fixture to move with the rotating axis, saves space and allows to realize the overall measurement system inside a smaller shielded room or chamber.

According to a further implementation form of the provided measurement system, the positioner consists of multiple nested rotational axes. Advantageously, several rotational axes allow realizing any desired movement of the positioner and the DUT. By way of example, the DUT may be positioned on a rotatable plate that is further attached to the positioner. Further, the positioner may include a horizontally orientated rotation axis and/or a vertical orientated rotation axis.

According to a further implementation form of the provided measurement system, a second test antenna is placed inside an outermost axis of the positioner such that the second test antenna is fixed relative to the DUT movement inside the positioner. Advantageously, the second test antenna increases the capability of the overall measurement system, since the second test antenna exemplarily allows the measurement of spurious emissions of the DUT, and simultaneously the first test antenna can measure parameters of interest from the DUT, such as signals in the in-band frequency range. Further, since the second antenna is located inside the outermost axis of the positioner it is ensured that the second antenna is not disturbed. In other words, the second antenna is de-coupled from unintended RF radiation emitted by the first test antenna and/or by any motor used with any positioning device.

According to a further implementation form of the provided measurement system, the second test antenna is de-coupled from the motor and the first test antenna such that no unintended RF radiation either from the motor or from the first test antenna is received by the second test antenna. Advantageously, the second test antenna is de-coupled from the motor and the first test antenna and does not receive any unintended RF radiation from the motor and the first test antenna that would negatively affect the measurement results taken by the second test antenna from RF radiation emitted from the DUT.

According to a further implementation form of the provided measurement system, the second test antenna is movable in the direction of the DUT such that it is positioned in the near field of the radiation emitted by the DUT. Advantageously, a linear movement of the second test antenna in direction of the DUT allows positioning the second test antenna in the near-field of the DUT. By way of example, the linear movement of the second test antenna may be orientated in the direction of the rotation axis incorporating the second test antenna. The second test antenna may be further moveable away from the DUT.

According to a second aspect of the invention, a method for performing measurements on a device under test (DUT), where the DUT is movable by a positioner with at least one axis of rotation, using an absorbing geometrical fixture, is provided. The method comprises the steps of sending radio frequency (RF) radiation to the DUT using a first test antenna and receiving RF radiation from the DUT using the first test antenna. The method further includes the steps of moving the DUT with a positioner using a motor, and separating the first test antenna and the motor from the DUT such that the DUT is de-coupled or shielded from the first test antenna and/or from the motor using the absorbing geometrical fixture configured to absorb RF radiation.

According to a first implementation form of the provided measurement method, the method further comprises the step of configuring a signal generator/analyzer unit configured to generate RF signals to be sent by the first test antenna indirectly to the DUT using a reflector, and to analyze RF radiation signals received by the first test antenna indirectly from the DUT using the reflector.

According to a further implementation form of the provided measurement method, the method further comprises the step of de-coupling the DUT from the first test antenna and the motor such that no unintended RF radiation either from the first test antenna or from the motor is received by the DUT, and/or that no unintended RF radiation from the DUT is received by the first test antenna.

According to a further implementation form of the provided measurement method, the method further comprises the step of mounting the absorbing geometrical fixture such that it is rotated with one of the axis of the positioner in order to reduce space between the positioner and the absorbing geometrical fixture.

According to a further implementation form of the provided measurement method, the method further comprises the step of placing a second test antenna inside an outermost axis of the positioner such that the second test antenna is fixed relative to the DUT movement inside the positioner. Further, the method may also comprise the step of de-coupling the second test antenna from the first test antenna and the motor of the positioner such that no unintended RF radiation neither from the first test antenna nor from the motor is received by the second test antenna.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A measurement system and corresponding method for measurements of a device under test (DUT), which includes a shield for shielding the DUT from unintended radio frequency radiation emitted by a motor and/or a test antenna, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Figure 1:
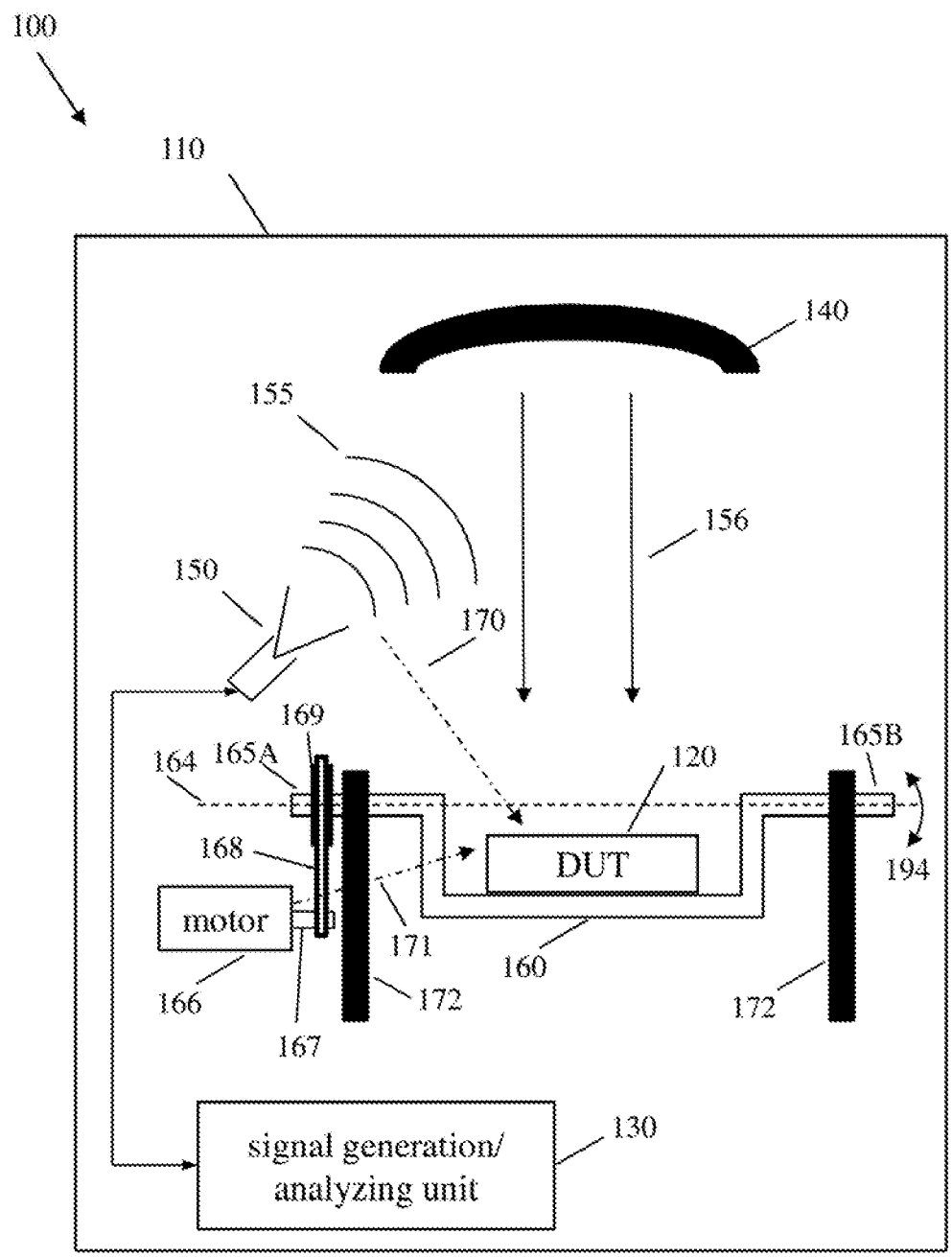
FIG. 1 shows a block diagram of a prior art measurement system for wireless devices with a u-shaped positioner.

FIG. 1 shows a block diagram of a prior art measurement system 100 for wireless devices with a u-shaped positioner.

The measurement system of FIG. 1, for example, may be used for performing regulatory/compliance testing such as electromagnetic compatibility (EMC), conformance testing such as protocol, radio frequency (RF), radio resource management (RRM) and location-based service (LBS), as well as performance testing such as over-the-air (OTA) measurements.

The measurement system 100 consists of a shielded anechoic measurement chamber 110 that comprises a first test antenna 150, such as a horn antenna. However, any other suitable antenna, such as an antenna provided with several antenna elements, may also be conceivable. The first test antenna 150 is connected to a signal generation/analyzing unit 130 via a cable connection. The signal generation/analyzing unit 130 is configured to generate appropriate test signals required according to a specific test plan, wherein the test signals are emitted by the first test antenna 150 as radio frequency (RF) radiation 155. The signal generation/analyzing unit 130 is further configured to analyze test signals received by the first test antenna 150 in order to perform the measurements required according to a specific test plan.

The first test antenna 150 is directed towards a reflector 140. The reflector 140 may be a parabolic reflector. However, any other suitable reflector type or any other suitable reflecting surface may also be used. The reflector 140 transforms the RF radiation 155, respectively the spherical electromagnetic waves received from the first test antenna 150, into plane waves 156 with far-field characteristics. More than one test antenna may be provided to improve far-field characteristics. The plane waves 156 are received by a device under test (DUT) 120. Thus, RF radiation 155 emitted by the first test antenna 150 is in-directly transmitted to the DUT 120 via the reflector 140. Analogously, RF radiation emitted from the DUT 120 is indirectly transmitted to the first test antenna 150 via the reflector 140.

The DUT 120 is positioned on a positioner 160 capable of holding and moving the DUT 120. The positioner 160 may be u-shaped and provided with at least one axis of rotation that allows a 360 rotational movement around its rotational axis. FIG. 1 shows an embodiment with the positioner 160 having a rotational axis 164 in the horizontal plane, parallel to the floor and ceiling of the shielded chamber 110. The two ends 165A, 165B of the positioner 160 serve as positioner axes that are supported by means of support elements 172. Thus, the positioner is rotatable clockwise and counterclockwise 194 around the rotational axis 164. Since the DUT 120 is positioned and held by the positioner 160 the DUT 120 is also moved clockwise or counterclockwise around the rotational axis 164.

At least one electrical motor 166 is provided to generate the movement of the positioner 160. The motor axis 167 of the motor 166, for example, is connected with the axis 165A of the positioner 160 via a belt. For example, the belt is carried by a pulley wheel 169 attached to the positioner axis 165A and by a suitable pulley wheel attached to the motor axis 167. Any other suitable construction to move the positioner using a motor is also conceivable.

The motor 166 can be directly connected (not shown) to the signal generation/analyzing unit for receiving appropriate control signals to perform the required positioner movements for a desired measurement. Alternatively, the motor can be controlled by a separate unit (not shown) that is able to provide the appropriate motor control signals.

Disadvantageously, the motor 166 not only generates the desired positioner movements but also generates unintended, unwanted electromagnetic waves that negatively affect the overall measurement results. For example, the unintended electromagnetic waves 171 can interfere with the RF radiation 156 coming from the reflector 140 and falsify measurements of the DUT.

Further, not only does the motor generate unwanted electromagnetic waves, but also the first test antenna 150 produces unwanted RF radiation, such as spurious emissions. Spurious emissions are any RF radiation not deliberately created or transmitted, such as with a device that normally creates other frequencies. For example, a harmonic or other signal outside of the assigned channel of a transmitter would be considered a spurious emission.

Figure 2:
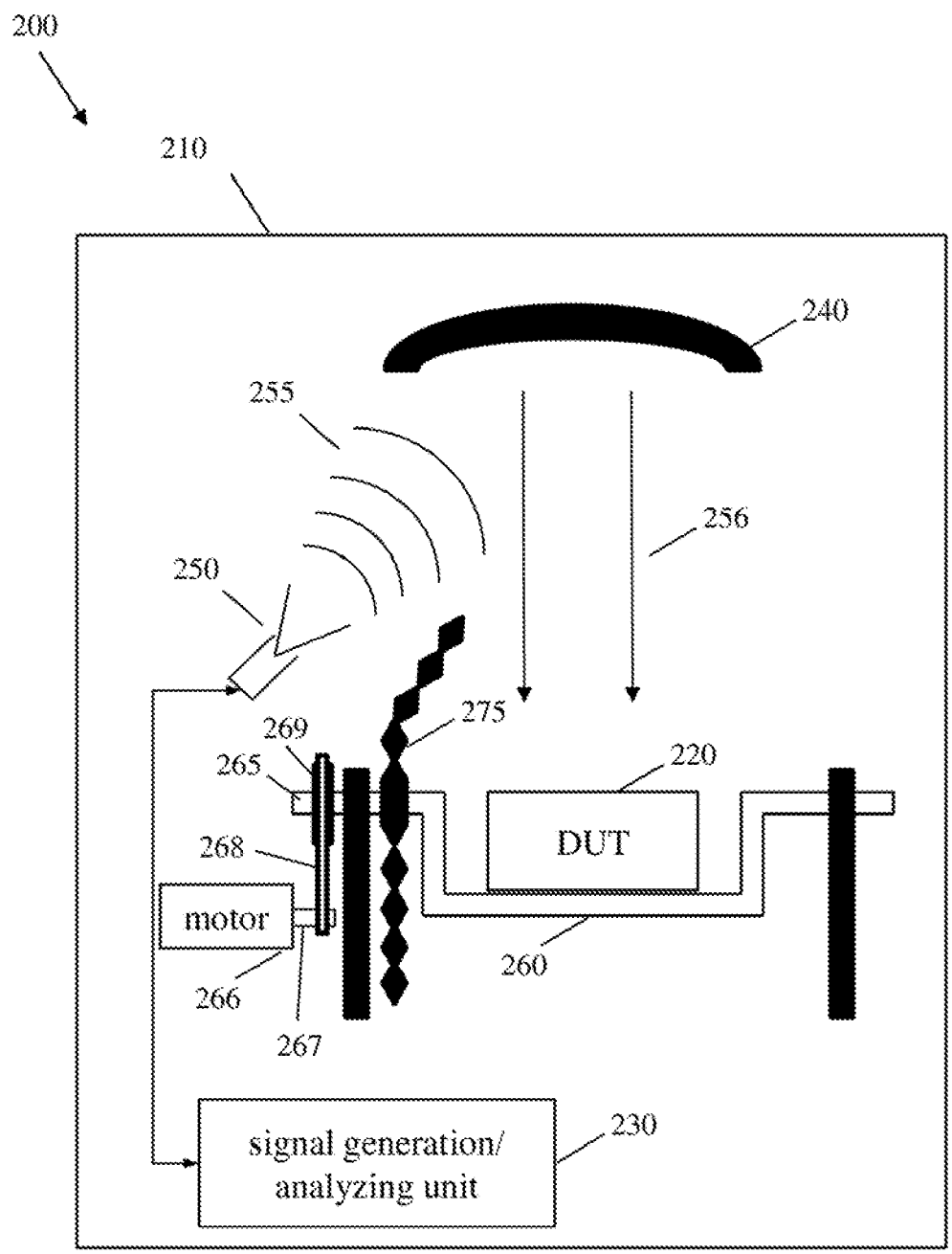
FIG. 2 shows a block diagram of a measurement system with a motor, a first test antenna and an absorbing geometrical fixture attached to a positioner, in accordance with example embodiments of the present invention.

FIG. 2 shows a block diagram of a measurement system with a motor, a first test antenna and an absorbing geometrical fixture attached to a positioner, in accordance with example embodiments of the present invention. The measurement system comprises a first test antenna, a positioner that uses a motor, and an absorbing geometrical fixture attached to the positioner to overcome the deficiencies mentioned in the description related to FIG. 1.

FIG. 2 is identical to FIG. 1, except for showing the additional absorbing geometrical fixture 275 that is positioned between the DUT 220 and the motor 266 and the first test antenna 250. Thus, the absorbing geometrical fixture 275 separates the motor 266 and the first test antenna 250 from the DUT 220, such that the DUT is de-coupled and shielded from the motor 266 and the first test antenna 250. In other words, minimal or no unintended RF radiation from the motor 266 and minimal or no unintended RF radiation from the first test antenna reaches the DUT 220. Thus, no unintended radiation either from the motor or from the first test antenna negatively affects the measurements of the DUT. Moreover, no unintended radiation emitted by the DUT can be received either by the measurement antenna or by the motor.

The absorbing geometrical fixture 275, such as a circular shaped area, is covered on both sides with an absorbing material capable of absorbing RF radiation. Radiation-absorbent material (RAM) is a material specifically designed and shaped to absorb RF radiation. The absorbing geometrical fixture can have any suitable shape depending on the measurements to be performed, the type of shielding chamber available, the measurement equipment provided and the size and/or radiation properties of the DUT.

The absorbing geometrical fixture 275 may be directly attached to the positioner 260 or integrally formed with the positioner 260. Thus, the absorbing geometrical fixture 275 is moved with the positioner. This ensures that the area within which the DUT is located is independent from the positioner movement, and that the DUT is shielded from unintended motor and test antenna radiation. Alternatively, a fixed and non-movable absorbing geometrical fixture would only provide appropriate shielding capabilities at certain positions of the DUT.

Further, in order to maximize usage of space within a shielded chamber, the absorbing geometrical fixture may be mounted such that it is rotated with one of the axis of the positioner.

Figure 3:
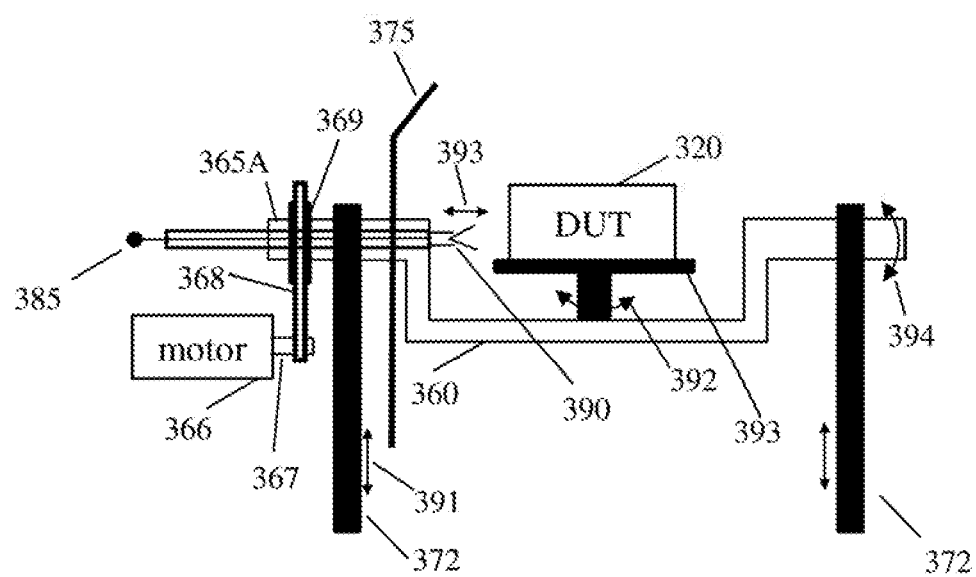
FIG. 3 shows a block diagram of an example measurement system that includes a second test antenna inside the outermost axis of the positioner, in accordance with example embodiments of the present invention.

FIG. 3 shows a block diagram of an example measurement system that includes a second test antenna inside the outermost axis of the positioner, in accordance with example embodiments of the present invention.

FIG. 3 shows a more detailed view of the positioner including the already described motor 366 with its motor axis 367, the u-shaped positioner 360 supported by means of support elements 372 and the absorbing geometrical fixture 375. To ensure readability, the absorbing geometrical fixture 375 has just been drawn as a line. FIG. 3 additionally shows a turntable 393 for positioning the DUT 320. The turntable 393 is part of the positioner 360 and provided with its own rotational axis allowing the turntable to rotate clockwise and counterclockwise 392 around its axis. In this embodiment the rotational axis of the turntable is arranged orthogonal to the rotational axis of the overall positioner. It is further conceivable that the support elements 372 may also be movable up and down, in other words the support elements allow a vertical movement of the positioner 360 and thus a vertical movement of the turntable 393 and the DUT 320.

FIG. 3 further shows a second test antenna 390 placed inside the outermost axis 365A of the positioner 360. The second test antenna 390 is directed to the DUT 320 and fixed relative to the DUT movement inside the positioner 360. The second test antenna 390 is provided with an output 385 that can be connected to the signal generation/analyzing unit 230. With the aid of the generation/analyzing unit 230 the second test antenna 390 is configured to transmit RF radiation to the DUT 320 and to receive RF radiation from the DUT 320.

It is further conceivable that the second test antenna 390 may be movable in the direction of the DUT 320 or away from the DUT 320, for example, using a linear actuator. The arrows indicated with referral number 393 within FIG. 3 indicate the movement toward and away from the DUT. This positioning option allows to position the second test antenna 390 in the near-field of the radiation emitted by the DUT 320.

Figure 4:
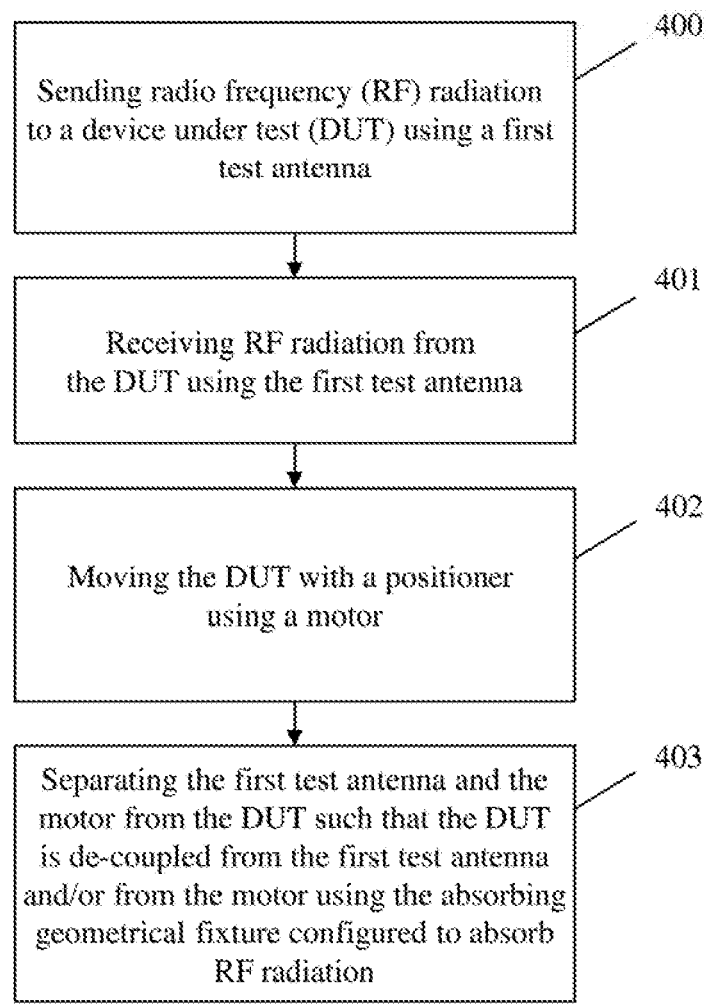
FIG. 4 shows a flow chart of a measurement method for performing measurements on a device under test (DUT), in accordance with example embodiments of the present invention.

FIG. 4 shows a flow chart of a measurement method for performing measurements on a device under test (DUT), in accordance with example embodiments of the present invention. In step S400, a first measurement antenna 250 sends radio frequency (RF) radiation 255 to a device under test (DUT) 220. By way of example, the RF radiation 255 is transmitted to a parabolic reflector 240 that transforms the spherical waves 255 received from the first test antenna 250 into plane waves 256 with far-field characteristics.

In step S401, the first test antenna 240 receives RF radiation emitted from the DUT 220. By way of example, the spherical waves emitted by the DUT 220 are transformed by the parabolic reflector 240 into plane waves to allow the first test antenna 250 far-field measurements.

In step S402, the DUT 220, which is placed on a positioner 260, is moved in any position required by a specific test plan. In order to move the positioner 260, and thus to also move the DUT 220, the positioner 260 is connected to a driving unit, such as a motor 266 supplied by an electrical source.

In step S403, an absorbing geometrical fixture 275, which is configured to absorb RF radiation, is provided to separate the first test antenna 250 and the motor 266 from the DUT 220, such that the DUT 220 is de-coupled from the first test antenna 250 and/or from the motor 266. In other words, the absorbing geometrical fixture 275 ensures that unintended RF radiation emitted from the motor 171 and/or unintended RF radiation emitted from the first test antenna 170 is/are not received by the DUT 220. By way of example, the absorbing geometrical fixture 275 includes RF radiation absorbing properties on both sides, and thus unintended RF radiation generated by the DUT 220 is blocked by the absorbing geometrical fixture 275 and cannot be received by the first test antenna 250 and/or by the motor 266.

While various embodiments of the present invention have been described above, it should be understood that they have been presented by way of example only, and not for limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement system for performing measurements of a device under test (DUT), comprising:
   a first test antenna configured to send radio frequency (RF) radiation to the DUT and to receive RF radiation sent by the DUT;
   a positioning device, including at least one motor, configured to move the DUT about at least one axis of rotation; and
   a geometrical fixture configured to absorb RF radiation and to de-couple or shield the DUT from unintended or spurious RF radiation of one or more of the at least one motor and the first test antenna; and
   wherein the geometrical fixture is directly attached to the positioning device or is integrally formed with the positioning device.

2. The measurement system according to claim 1, wherein the measurement system is located inside a shielded chamber.

3. The measurement system according to claim 1, further comprising:
   a signal generator/analyzer configured to generate, receive and analyze RF signals.

4. The measurement system according to claim 1, further comprising:
   a reflector positioned such that one or more of the RF radiation sent by the first test antenna is received indirectly by the DUT via the reflector and the RF radiation sent by the DUT is received indirectly by the first test antenna via the reflector.

5. The measurement system according to claim 1, wherein the DUT is de-coupled or shielded from the at least one motor and the first test antenna such that one or more of the following results—no unintended RF radiation either from the at least one motor or from the first test antenna is received by the DUT, and no unintended RF radiation from the DUT is received by the first test antenna.

6. The measurement system according to claim 1, wherein the DUT is located in a far-field of the RF radiation sent by the first test antenna.

7. The measurement system according to claim 1, wherein the positioning device and the geometrical fixture are movable upwards and downwards.

8. The measurement system according to claim 7, wherein a distance by which the positioning device can be moved upwards and downwards depends on measurement frequency bands of the RF radiation sent by the first test antenna.

9. The measurement system according to claim 1, wherein the positioning device operates relative to multiple nested rotational axes.

10. The measurement system according to claim 1, further comprising:
   a second test antenna located inside an outermost axis of the positioning device such that the second test antenna is fixed relative to movement of the DUT by the positioning device.

11. The measurement system according to claim 10, wherein the second test antenna is de-coupled or shielded from the at least one motor and the first test antenna such that no unintended RF radiation either from the at least one motor or from the first test antenna is received by the second test antenna.

12. The measurement system according to claim 10, wherein the second test antenna is movable in a direction of the DUT such that it remains positioned near field of the RF radiation sent by the DUT.

13. A measurement system for performing measurements of a device under test (DUT), comprising:
   a first test antenna configured to send radio frequency (RF) radiation to the DUT and to receive RF radiation sent by the DUT;
   a positioning device, including at least one motor, configured to move the DUT about at least one axis of rotation; and
   a geometrical fixture configured to absorb RF radiation and to de-couple or shield the DUT from unintended or spurious RF radiation of one or more of the at least one motor and the first test antenna; and
   wherein the geometrical fixture is mounted such that it rotates with at least one of the at least one axis of rotation of the positioning device in order to reduce space between the positioning device and the geometrical fixture.

14. A method for performing measurements of a device under test (DUT), the method comprising:
   sending, via a first test antenna, radio frequency (RF) radiation to the DUT;
   receiving, via the first test antenna, RF radiation sent by the DUT; and
   moving the DUT, using a positioning device including at least one motor, about at least one axis of rotation; and
   wherein one or more of the first test antenna and the at least one motor are de-coupled or shielded from the DUT by a geometrical fixture configured to absorb RF radiation, and
   wherein the geometrical fixture is mounted such that such that it rotates with at least one of the at least one axis of rotation of the positioning device in order to reduce space between the positioning device and the geometrical fixture.

15. The method according to claim 14, further comprising:
   generating, by a signal generator/analyzer, RF signals to serve as a basis for the RF radiation sent to the DUT via the first test antenna, and wherein the RF radiation sent to the DUT via the first test antenna is indirectly received by the DUT via a reflector; and
   analyzing, by the signal generator/analyzer, the RF radiation sent by the DUT, and wherein the RF radiation sent by the DUT is indirectly received by the first test antenna via the reflector.

16. The method according to claim 14, wherein the DUT is de-coupled or shielded from the first test antenna and the at least one motor such that one or more of the following results—no unintended RF radiation either from the first test antenna or from the at least one motor is received by the DUT, and that no unintended RF radiation from the DUT is received by the first test antenna.

17. The method according to claim 14, wherein a second test antenna is located inside an outermost axis of the positioning device such that the second test antenna is fixed relative to movement of the DUT by the positioning device.

18. The method according to claim 14, wherein the second test antenna is de-coupled or shielded from the at least one motor and the first test antenna such that no unintended RF radiation either from the at least one motor or from the first test antenna is received by the second test antenna.

* * * * *